United States Patent [19]

Iwasaki

[11] 4,246,596

[45] Jan. 20, 1981

[54] HIGH CURRENT PRESS PACK SEMICONDUCTOR DEVICE HAVING A MESA STRUCTURE

[75] Inventor: Masami Iwasaki, Kawasaki, Japan

[73] Assignee: Tokyo Shibaura Denki Kabushiki Kaisha, Kawasaki, Japan

[21] Appl. No.: 956,608

[22] Filed: Nov. 1, 1978

[30] Foreign Application Priority Data

Jan. 7, 1978 [JP] Japan .................... 53/376

[51] Int. Cl.³ .............. H01L 23/42; H01L 23/44; H01L 23/46
[52] U.S. Cl. .................... 357/79; 357/71; 357/74; 357/81; 357/56
[58] Field of Search .............. 357/71, 74, 79, 81, 357/56

[56] References Cited

U.S. PATENT DOCUMENTS

| | | |
|---|---|---|
| 3,525,910 | 8/1970 | Philips .................... 357/79 |
| 3,581,163 | 5/1971 | Eriksson .................. 357/79 |
| 3,652,904 | 3/1972 | Takahashi et al. ........ 357/79 |
| 3,654,529 | 4/1972 | Lord ....................... 357/79 |
| 4,035,831 | 7/1977 | Saeki ...................... 357/79 |
| 4,079,409 | 3/1978 | Rathmann ................ 357/79 |
| 4,099,201 | 7/1978 | Mueller ................... 357/79 |
| 4,127,863 | 11/1978 | Kurata ..................... 357/79 |
| 4,141,030 | 2/1979 | Eisele et al. .............. 357/79 |
| 4,155,155 | 5/1979 | Bourdon et al. .......... 357/79 |

Primary Examiner—Andrew J. James
Attorney, Agent, or Firm—Oblon, Fisher, Spivak, McClelland & Maier

[57] ABSTRACT

A press pack semiconductor device comprising a semiconductor element having a mesa formed on a main surface thereof, first, second and third electrodes, a supporting plate fixed to the third electrode, a first intermediate plate which is movably attached to the surface of the first electrode and which is thin, a first disc and a second disc respectively electrically connected through the first intermediate plate to the first electrode and through the supporting plate to the third electrode and a housing surrounding the semiconductor element. The first intermediate plate protects the semiconductor element from being subjected to great stress.

6 Claims, 4 Drawing Figures

HIGH CURRENT PRESS PACK SEMICONDUCTOR DEVICE HAVING A MESA STRUCTURE

BACKGROUND OF THE INVENTION

This invention relates to a press pack semiconductor device having an improved intermediate electrode attached to a semiconductor element.

The press pack semiconductor device such as the Giant Transistor or Gate Turn Off Thyristor (respectively shortened to G-Tr or GTO in the following) has been applied for use as a high power device which has current ratings of more than 100 amperes. The press pack semiconductor device would be destroyed by high current if current concentration were to occur therein when turned on or when turned off. Accordingly, the semiconductor element of the press pack semiconductor device generally is formed in a mesa structure to protect the semiconductor element from current concentration. The mesa is so formed in an emitter region of the G-Tr element in a predetermined pattern as to divide the current flowing in the semiconductor device. The whole surface of an emitter electrode layer formed on the mesa-top of the silicon pellet is substantially short-circuited by a thick intermediate plate for decreasing thermal stress between the semiconductor element and a first disc. The thick intermediate plate is selected from a material such a molybdenum whose coefficient of thermal expansion is close to that of the silicon pellet and is electroconductive and then is formed in the plate construction to short-circuit the whole surface of the emitter electrode layer. A cathode region of the semiconductor element fixed on a supporting plate is connected to a second disc. A housing is disposed to surround the semiconductor element which is pressed by both the first disc and the second disc.

Since the thickness of the intermediate plate of the prior art semiconductor device is larger than half of the ditch width of the mesa, the cathode electrode layer of, for example, aluminum on the mesa top will be fixed solidly to the thick intermediate plate in an alloy at a relatively low temperature by heat originated near the contact area between the thick intermediate plate and the cathode electrode layer when the semiconductor device is activated at high power if the contact area is small and is subject to a high pressure. Great stress in the thick intermediate plate rigidly attached to the silicon pellet will change the crystal structure of the silicon pellet to cause a deteriorated characteristic of the semiconductor device and will rupture the semiconductor element because the molybdenum-aluminum alloy has a different coefficient of thermal expansion than silicon. In consequence, there is a need for a new press pack semiconductor device which can prevent current concentration.

SUMMARY OF THE INVENTION

An object of the present invention is to provide a press pack semiconductor device having satisfactory electric characteristics.

Another object of the present invention is to provide a press pack semiconductor device which can endure thermal fatigue.

Further object of the present invention is to provide a press pack semiconductor device which can decrease the stress arising in the combination of a first disc and a second disc pressed against a semiconductor element.

The objects of the present invention are achieved by a press pack semiconductor device comprising a semiconductor element including a mesa formed on a main surface thereof, a first electrode formed on the top of the mesa, a second electrode formed on the bottom of the mesa and a third electrode formed on the other main surface thereof; a supporting plate fixed to the third electrode; a first intermediate plate which is attached to the surface of the first electrode and which is thin; a first disc and a second disc respectively electrically connected through the first intermediate plate to the first electrode and through the supporting plate to the third electrode, a housing of an insulating material surrounding the semiconductor element; a flange section disposed in an external portion of the housing and a lead electrically connecting together the second electrode and the flange section.

BRIEF DESCRIPTION OF THE DRAWINGS

A more complete appreciation of the invention and may of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

This invention will be explained below be referring to the accompanying drawings.

Figure 1:
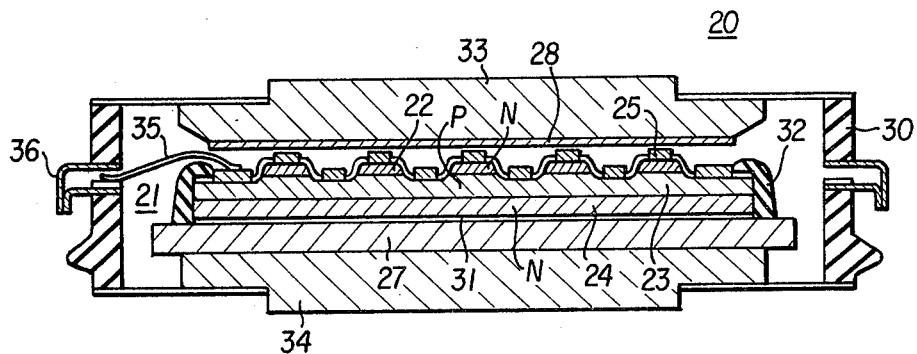
FIG. 1 is a sectional view of a press pack semiconductor device according to one embodiment of the present invention.
Figure 2:
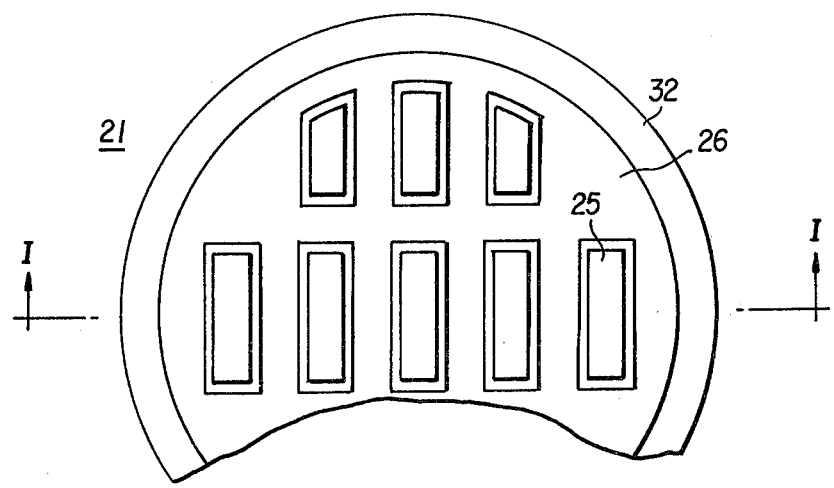
FIG. 2 is a plan view of a semiconductor element.
Figure 3:
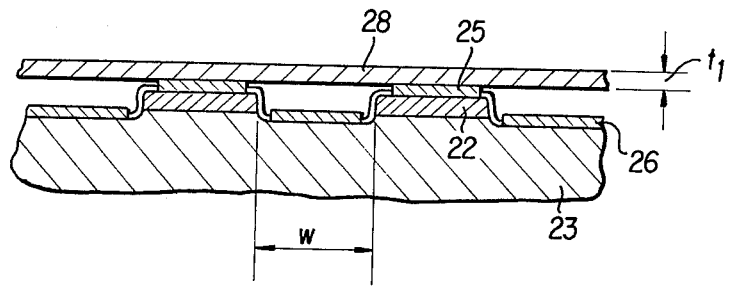
FIG. 3 is a partial sectional view of the semiconductor device illustrated in FIG. 1.

As shown in FIG. 1, a press pack semiconductor device 20 comprises an NPN transistor element 21 such as G-Tr element having a mesa formed on a main surface thereof in a predetermined pattern. An emitter electrode layer 25 is formed on an exposed N type emitter region 22 of the mesa top, a base electrode layer 26 is formed on an exposed P type base region 23 of the mesa bottom and a collector electrode is formed on an N type collector region 24. A plan view of the semiconductor element 21 on which the emitter and the base electrodes 25, 26 are formed is shown in FIG. 2. The semiconductor pellet 21 is mounted on a supporting plate 27 by a thin layer 31 of aluminum. Numeral 28 is a first intermediate plate for decreasing the thermal stress in the semiconductor 21.

It is generally desired that the coefficient of thermal expansion of the intermediate plate, in particular the plate connected to the semiconductor element, be close to and preferably equal to the coefficient of thermal expansion of the semiconductor element material e.g. silicon, since the first intermediate plate is interposed between the emitter electrode of the semiconductor element and the first disc and is in contact with the semiconductor pellet under pressure. Accordingly, considering the above, molybdenum, tungsten or the like is suitable for the intermediate plate. Both the first disc 33 and the second disc 34 in the semiconductor device 20 press against the first intermediate plate 28, the supporting plate 27 and the semiconductor element 21 disposed therebetween to be electrically connected to the emitter region 22 and the collector region 24 of the semiconductor element 21 respectively. The base electrode layer 26 of the semiconductor element 21 is connected through a base lead 35 to a flange section 36 formed in the external portion of a housing 30 of an insulating material such as a ceramic. Numeral 32 is a protective coating such as silicon rubber or glass for protecting the PN junction and the active region of the semiconductor element 21.

The first intermediate plate 28 is so formed as to have a thickness no more than half the ditch width of the mesa on the one surface of the semiconductor element. This relationship can be stated mathematically as $t_1 \leq \frac{1}{2}(W)$, where "$t_1$" is the thickness of the first intermediate plate; and "W" is the ditch width of the mesa.

In the semiconductor device described above, hardly any of an aluminum-molybdenum alloy is formed between the first intermediate plate and the emitter electrode of aluminum in contact therewith even though much heat occurs in the contact area between the first intermediate plate and the emitter electrode layer when a high current flows into the semiconductor device. The first intermediate plate reduces transmission of stress to the semiconductor element, since the first intermediate plate can move to the electrode layer of the semiconductor element, as described in the above. That is to say, it will be appreciated that the first intermediate plate is an important material for decreasing the thermal stress.

Figure 4:
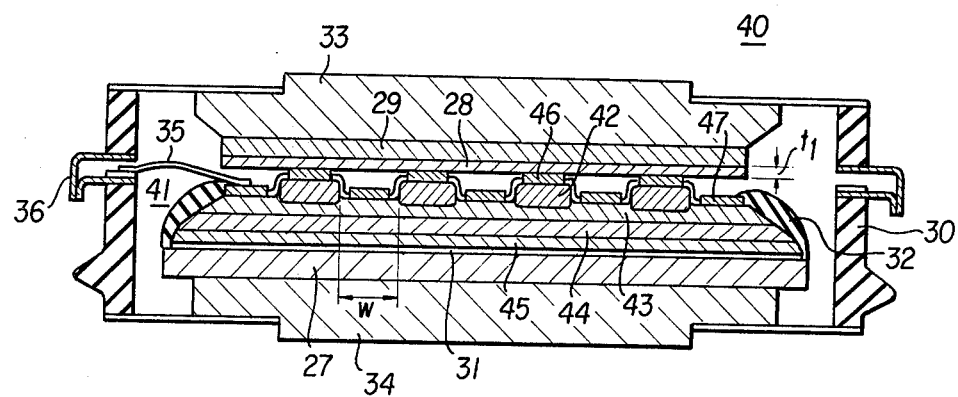
FIG. 4 is a sectional view of a press pack semiconductor device according to another embodiment of the present invention.

Next, another embodiment of the present invention is described in the following. Referring now to FIG. 4, the press pack semiconductor device 40 of the present invention comprises a PNPN type GTO element 41 of silicon having a level structure and a mesa structure. A cathode electrode layer 46 and a gate electrode layer 47 of aluminum are respectively formed on the mesa top and on the mesa bottom of the GTO element 41. Then the GTO element 41 firmly fixed through a thin aluminum layer 31 to a supporting plate 27 is pressed by a first disc 33 and a second disc 34.

A first intermediate plate 28 short-circuiting the whole surface of the cathode electrode layer 46 and a second intermediate plate 29 movably placed thereon are disposed between the GTO element 41 and the external electrode 33. The first intermediate plate for preventing the silicon element from being cracked by thermal distortion can be a thermally conductive material and can have the same coefficient of thermal expansion as the coefficient of thermal expansion of silicon, i.e. $2.5 \times 10^{-6}$ (deg$^{-1}$). Molybdenum with a coefficient of thermal expansion, $5.0 \times 10^{-6}$ (deg$^{-1}$), and a coefficient of thermal conductivity, 1.4 (w/cm.deg.) or tungstenum with a coefficient of thermal expansion, $4.5 \times 10^{-6}$ (deg$^{-1}$), and a coefficient thermal conductivity 1.7 (w/cm.deg.) is suitable for the intermediate plate. The first intermediate plate thickness "$t_1$" must be so formed as to be half of the ditch width of the mesa. The width is usually formed about 100μ to 300μ.

Since the pressure applied to the intermediate plates 28, 29 and the silicon element 41 mounted on the supporting element 27 interposed between the first disc 33 and the second disc 34 is almost absorbed by an air gap between the first intermediate plate 28 and the mesa ditch formed on the semiconductor element 41, even though the first intermediate plate 28 is mechanically deformed, the first intermediate plate will return to its original shape if the first intermediate plate thickness is half that of the ditch width of the mesa, in particular about 50μ to 150μ.

The material of the second intermediate plate may be similar to that of the first intermediate plate, preferably the same material if possible. It is desirable that the second intermediate plate not have a thickness less than that of the first intermediate plate. "Sag" of the second intermediate plate due to pressure of the first disc on the hard intermediate plate attached thereto is absorbed. Particularly, it is possible for the two first and second intermediate plates to prevent the sag of the intermediate plates from being caused by the difference of the coefficient of thermal expansion between the intermediate plate and the first disc.

For this reason, the short-circuit of the cathode electrode of the semiconductor element to the gate electrode thereof occurs hardly at all. The supporting plate soldered by a thin aluminum layer on the other surface of the semiconductor element can be the same material as the intermediate plate. The silicon element can be held on a supporting plate which is larger in diameter than the semiconductor element, wherein the supporting plate is soldered to the second disc by a gold tin mixture. In other words, the GTO element is electrically and thermally connected to the second disc through a supporting plate interposed therebetween.

In consequence, the first intermediate plate 29 can smoothly move to the aluminum layer 46 on the surface of the semiconductor element 41. The GTO element 41 pressed by the first disc 33 and the second disc 34 is airtightly encapsulated by the housing 30 consisting of covers of a nickel iron alloy, namely TNR, and a cylindrical ceramic envelope. The gate electrode layer 47 formed on the mesa bottom is electrically connected through a lead 35 to a flange section 36 formed in the external portion of the housing 30.

Since the first intermediate plate thickness is equal to or less than half of the mesa ditch width on the surface of the semiconductor element and the second intermediate plate thickness is formed as to be more than half of the ditch width of the mesa thereon, the first intermediate plate is scarcely deformed, because the second intermediate plate operates so that the deformed part thereof by the thermal expansion is returned to the original shape. By using a hard material such as molybdenum or tungsten, the first intermediate plate is not ruptured and is hardly deformed. Therefore, the cathode electrode layer on the mesa top formed on the surface of the semiconductor element is hardly short-circuited to the gate electrode layer on the mesa bottom formed thereon. Since the first intermediate plate thickness is formed to be equal to or less than half of the ditch width of the mesa, the first intermediate plate can easily move to the aluminum layer and it may be difficult for aluminum to be melted by resistance heating occurring in the contact area between the first intermediate plate and aluminum attached thereto.

The invention has been described in considerable detail with particular reference to certain preferred embodiments thereof, but it will be understood that variations and modifications can be effected without departing from spirit and scope of the invention.

What is claimed as new and desired to be secured by Letters Patent of the United States is:

1. Press pack semiconductor device comprising:

(a) a semiconductor element having two main surfaces, at least one mesa formed on one of the main surfaces, a first electrode formed on the top of said mesa, a second electrode formed on the bottom of said mesa, and a third electrode formed on the other main surface;

(b) a supporting plate fixed to said third electrode;

(c) a first intermediate plate attached to the surface of said first electrode and a second intermediate plate interposed between said first intermediate plate and first disc, the thickness of said first intermediate plate being equal to or less than half of the ditch width of said mesa;

(d) said first disc and a second disc respectively electrically connected through said first intermediate plate to said first electrode and through said supporting plate to said third electrode;

(e) an insulating housing surrounding said semiconductor element;

(f) a flange section disposed in an external portion of said housing; and (g) a lead for electrically connecting together said second electrode and said flange section.

2. The press pack semiconductor device according to claim 1, wherein:
said second intermediate plate has a thickness greater than the thickness of said first intermediate plate.

3. The press pack semiconductor device according to claim 2, wherein:
the coefficient of thermal expansion of said second intermediate plate is substantially equal to the coefficient of thermal expansion of said first intermediate plate.

4. The press pack semiconductor device according to claim 2, wherein:
the materials of said first and second intermediate plates are the same.

5. The press pack semiconductor device according to claim 1, wherein:
the material of said first intermediate plate is molybdenum.

6. The press pack semiconductor device according to claim 1, wherein:
the material of said first intermediate plate is tungsten.

* * * * *